(12) United States Patent
Ament et al.

(10) Patent No.: US 10,712,677 B2
(45) Date of Patent: Jul. 14, 2020

(54) PROJECTION EXPOSURE SYSTEM FOR SEMICONDUCTOR LITHOGRAPHY, COMPRISING ELEMENTS FOR PLASMA CONDITIONING

(71) Applicant: Carl Zeiss SMT GmbH, Oberkochen (DE)

(72) Inventors: Irene Ament, Aalen (DE); Dirk Heinrich Ehm, Beckingen (DE); Stefan Wolfgang Schmidt, Aalen (DE); Moritz Becker, Aalen (DE); Stefan Wiesner, Lauchheim (DE); Diana Urich, Munich (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 16/198,331

(22) Filed: Nov. 21, 2018

(65) Prior Publication Data
US 2019/0243258 A1    Aug. 8, 2019

Related U.S. Application Data

(63) Continuation of application No. PCT/EP2017/059229, filed on Apr. 19, 2017.

(30) Foreign Application Priority Data

May 23, 2016 (DE) .......... 10 2016 208 850

(51) Int. Cl.
*G03B 27/54* (2006.01)
*G03F 7/20* (2006.01)
*B08B 7/00* (2006.01)

(52) U.S. Cl.
CPC ........ *G03F 7/70925* (2013.01); *B08B 7/0035* (2013.01); *G03F 7/70033* (2013.01);
(Continued)

(58) Field of Classification Search
CPC ............. G03F 7/70925; G03F 7/70033; G03F 7/70883; G03F 7/70916; G03F 7/70933; B08B 7/0035
See application file for complete search history.

(56) References Cited

U.S. PATENT DOCUMENTS

| 6,511,575 B1 * | 1/2003 | Shindo .................. B08B 7/0035 204/298.34 |
| 2011/0043774 A1 * | 2/2011 | Hembacher ......... G03F 7/70925 355/30 |

(Continued)

FOREIGN PATENT DOCUMENTS

| DE | 102009045170 A1 | 4/2011 |
| DE | 102011080409 A1 | 12/2012 |

(Continued)

OTHER PUBLICATIONS

Sporre, et al., "Development of an in-situ Sn cleaning method for extreme ultraviolet light lithography", SPIE, vol. 7969, Mar. 17, 2011, 9 pages.

(Continued)

*Primary Examiner* — Peter B Kim
(74) *Attorney, Agent, or Firm* — Edell, Shapiro & Finnan, LLC

(57) ABSTRACT

A projection exposure apparatus (400) for semiconductor lithography contains at least one partial volume (4) that is closed off from the surroundings. The partial volume (4) contains a gas, from which a plasma can be produced. Conditioning elements (20, 21, 22, 23, 24, 25) for conditioning the plasma, in particular for neutralizing the plasma, are present in the partial volume. An associated method for operating a projection exposure apparatus is also disclosed.

18 Claims, 4 Drawing Sheets

(52) U.S. Cl.
CPC ...... *G03F 7/70883* (2013.01); *G03F 7/70916* (2013.01); *G03F 7/70933* (2013.01)

(56) References Cited

U.S. PATENT DOCUMENTS

| | | |
|---|---|---|
| 2011/0058147 A1 | 3/2011 | Ehm et al. |
| 2012/0223256 A1 | 9/2012 | Bykanov et al. |
| 2012/0250144 A1 | 10/2012 | Ehm et al. |
| 2013/0070218 A1* | 3/2013 | Ivanov ................ G03F 7/70916 355/30 |
| 2016/0187543 A1* | 6/2016 | Bekman .................. G02B 1/14 359/360 |

FOREIGN PATENT DOCUMENTS

| | | | |
|---|---|---|---|
| DE | 102013209442 A1 | 11/2014 | |
| JP | 2010062422 A | 3/2010 | |
| WO | WO-2009059614 A1 * | 5/2009 | ............... B08B 7/00 |

OTHER PUBLICATIONS

International Search Report, PCT/EP2017/059229, date of completion, Jul. 19, 2017, 3 pages.

PCT InternationL Preliminary Report on Patentability, PCT/EP2017/059229, Nov. 27, 2018, 8 pages.

\* cited by examiner

PROJECTION EXPOSURE SYSTEM FOR SEMICONDUCTOR LITHOGRAPHY, COMPRISING ELEMENTS FOR PLASMA CONDITIONING

CROSS REFERENCE TO RELATED APPLICATIONS

This is a Continuation of International Application PCT/EP2017/059229, which has an international filing date of Apr. 19, 2017, and the disclosure of which is incorporated in its entirety into the present Continuation by reference. This Continuation claims foreign priority under 35 U.S.C. § 119(a)-(d) to German patent application 10 2016 208 850.5, filed May 23, 2016, the entire contents of which is fully incorporated into the present application by reference.

FIELD OF THE INVENTION

The invention relates to a projection exposure apparatus for semiconductor lithography comprising at least one element for plasma conditioning.

BACKGROUND

In modern projection exposure apparatuses, electromagnetic radiation in the extremely short-wavelength range, so called EUV radiation, is used for producing very fine structures on semiconductor wafers. Typically, this radiation is produced in a plasma source, subsequently conditioned by way of an illumination system and initially used for illuminating a mask, a so-called reticle, wherein the structures on the reticle are imaged, in a reduced fashion, as a rule, on a semiconductor substrate, the so-called wafer, by way of a projection optical unit. Conventional transmissive or refractive optical elements, such as lens elements, for example, are non-transparent to the aforementioned, extremely short-wavelength radiation, and so reflective elements, so called multi-layer mirrors, are used, as a rule, for conditioning the radiation in the illumination system and for imaging the reticle on the wafer. These multi-layer mirrors are often mounted in an encapsulated partial volume, a so-called mini-environment. There usually is a high vacuum in the aforementioned mini-environment, said high vacuum being purged in regions by hydrogen as a purge gas for the purposes of reducing contamination. However, the action of the EUV radiation, which is used for imaging purposes, on the gaseous hydrogen present in the system leads, in part, to unwanted side effects. The EUV radiation, on account of its high energy, has an ionizing effect on the hydrogen, and so hydrogen ions or a highly diluted plasma arise(s) on account of the action of the EUV radiation on the purge gas. Here, the presence of the plasma has different effects on the optical elements situated in the mini-environments and, in particular, on the surfaces of the multi-layer mirrors. Firstly, the plasma exhibits a certain cleaning effect, which is certainly desired, and so a comparatively high reflectivity of the employed mirror surfaces is maintained as a result of the presence of the plasma. On the other hand, however, an effect that may, for example, occur is that arising hydrogen ions penetrate into the reflective layers of the employed mirrors, recombine there to form $H_2$ and lead to the formation of bubbles or to local splitting of coatings of the mirrors on account of the increased volume requirement.

Thus, it is desirable to influence the plasma spontaneously arising in the mini-environments during the operation of an EUV projection exposure apparatus in such a way that, firstly, the damaging effect of the plasma is reduced and, secondly, the cleaning effect of the plasma is optimized. By way of example, the German laid-open application DE 10 2013 209 442 A1 has disclosed concepts for deflecting plasma constituents from optical or electronic components of an EUV projection exposure apparatus.

SUMMARY

It is an object of the present invention to make spontaneously arising plasma more controllable in projection exposure apparatuses for semiconductor lithography, in particular in EUV projection exposure apparatuses.

This object is achieved according to two representative formulations, with the apparatus and method having the features specified in the independent claims. The dependent claims concern advantageous embodiments and variants of the invention.

A projection exposure apparatus according to the invention for semiconductor lithography contains at least one partial volume or mini-environment that is closed off from the surroundings, this partial volume containing a purge gas from which a plasma can be produced. As a rule, further elements, in particular optical elements, will be arranged in the aforementioned partial volume. Further, conditioning elements for conditioning the plasma in the partial volume are present. The gas present in the mini environment can be hydrogen, in particular, said hydrogen spontaneously forming a very dilute plasma under the action of the EUV radiation. According to the invention, the conditioning elements are suitable for an at least partial neutralization of the plasma. By way of example, this can be achieved by virtue of the conditioning elements being able to locally introduce a gas for reducing the plasma concentration. In order to be able to better delimit the spatial region treated thus, it is possible to create a local sub-volume within the mini-environment, it being possible to introduce the neutralization gas into the local sub-volume such that the gas preferably acts only on the plasma in this region.

By way of example, a local pressure increase can be achieved by metering-in a gas, which leads to an increased formation of NH-compounds when using nitrogen as an introduced gas, for example, as a result of which the hydrogen plasma can ultimately be neutralized.

In order to neutralize the plasma or to reduce the plasma concentration, it may also be expedient to locally introduce electrons, for example using an electron gun, which electrons can be captured by the hydrogen ions, which can lead, in turn, to a recombination of the plasma constituents to $H_2$.

However, the local plasma concentration can also be adapted by virtue of the conditioning elements being suitable for influencing local partial pressures of the purge gas. Here it is conceivable, for example, for conditioning elements to be equipped with suitably positioned gas inlets, by which the purge gas is conveyed into the interior of the mini-environment. In particular, a certain control effect can be achieved by virtue of the aforementioned gas inlets being embodied to be movable. Here, purely selecting the location of the introduction of the purge gas can influence the plasma concentration, without necessarily the change in the local partial pressure of the purge gas leading to a partial neutralization of the plasma. Consequently, the plasma also can be conditioned without neutralization.

As an alternative or in addition to the measures described above, conditioning elements with which the electric potential of the elements arranged in the partial volume, such as, e.g., mirrors or the like, can be influenced may be present;

to this end, in particular, the conditioning elements can be realized as a voltage source with an electric connection to the aforementioned elements. Thus, what the application of a positive potential, for example to a multi-layer mirror, can achieve is that positively charged hydrogen ions are repelled from this mirror during the operation of the apparatus, in particular in order to avoid the above-described disadvantageous effects (bubble formation and splitting on account of $H_2$ recombination). Likewise, a negative potential may be applied to the mirror in cases where it is desirable to bring the plasma into contact with the mirror surface such that the ions are attracted by the mirror, for example for cleaning purposes.

Thus, overall, an adjustable electric potential is advantageous for the optical elements. In this case, too, the plasma is conditioned without a neutralization.

In addition or as an alternative to the aforementioned measures, conditioning elements that are suitable for producing a directed ion beam may also be present, said ion beam then being able to treat, in particular clean, certain regions of elements in the apparatus in a targeted manner.

Here, advantageously use can be made, in particular, of the design of the partial volume assigned to the respective element. For certain elements, in particular optical elements, the aforementioned partial volume is embodied as the "mini-environment" already mentioned above, said mini environment surrounding the radiation, which is incident on the optical element, within its geometric envelope through a housing. If a potential is applied to this housing, the sign of said potential corresponding to that of the ions in the ion beam, the housing acts in the style of the Wehnelt cylinder known from cathode ray tubes and thus produces a denser region of ions in the central region of the mini-environment, wherein the ions, by way of the potential of the element already referred to above, are accelerated towards the latter, for example. In this variant, a constituent part of the apparatus, already present in any case, acts as a conditioning element with an advantageous double effect.

Likewise, in addition or as an alternative to the aforementioned measures, separate conditioning elements may be providable with an adjustable electrical potential such that they are able to steer the plasma in the corresponding partial volume by way of their presence in a certain spatial region.

Likewise, in addition or as an alternative to the above-described measures, it is conceivable for conditioning elements to be selected in such a way that they are suitable for producing a magnetic field. The moving, electrically charged hydrogen ions or constituents of the plasma, such as electrons, for example, are then steered in the respectively desired direction on account of the Lorentz force.

In an advantageous variant of the invention, the conditioning, in particular the neutralization of the plasma, may occur at those times in which there is no exposure such that a reduction in the imaging quality as a result of conditioning measures of the plasma can be largely precluded.

BRIEF DESCRIPTION OF THE DRAWINGS

Exemplary embodiments and variants of the invention are explained in greater detail below with reference to the drawing. In the figures.

DETAILED DESCRIPTION

Figure 1:
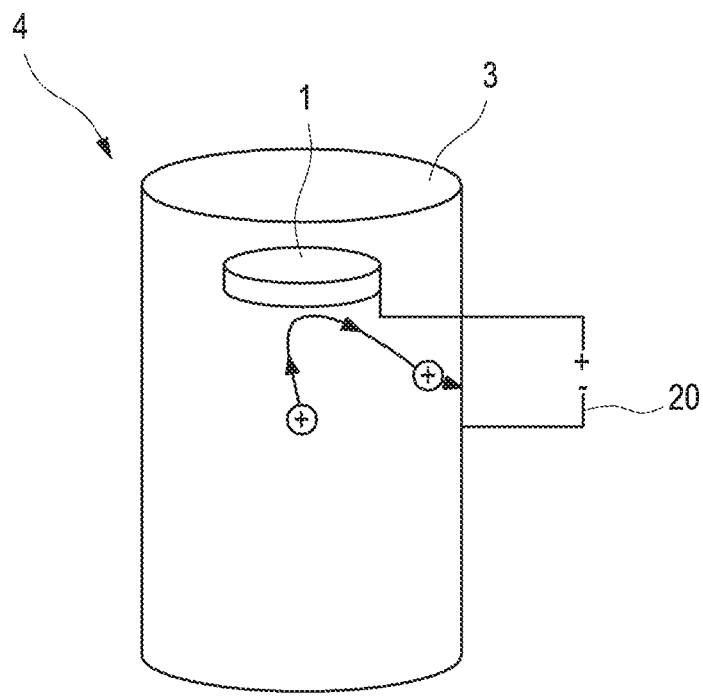
FIGS. 1A and 1B show a first embodiment of the invention with a controllable voltage source applying, respectively, a positive potential and a negative potential to an optical element.
Figure 1:
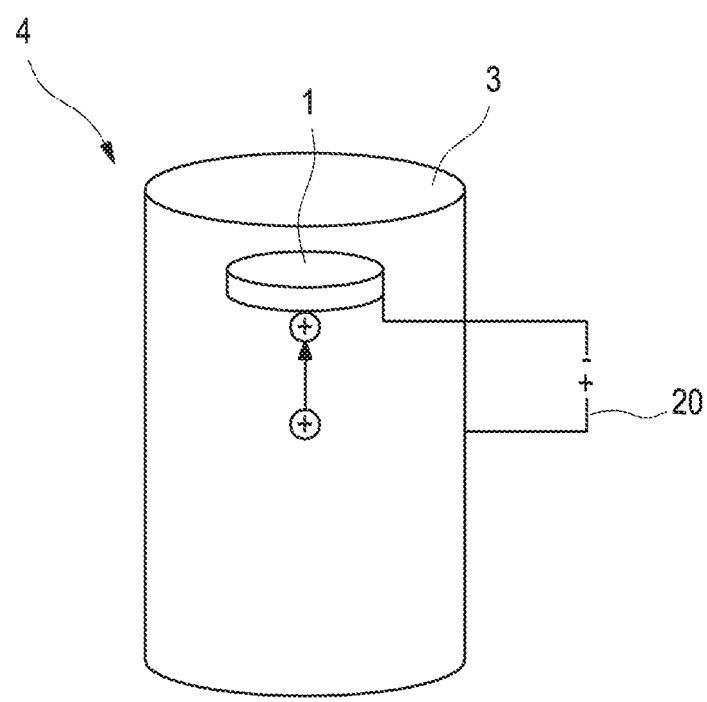

Partial FIGS. 1A and 1B show a first embodiment of the invention, in which, in an exemplary fashion, a potential can be applied to an optical element 1, which in this case is a multi-layer mirror, for EUV semiconductor lithography, arranged in a mini-environment 4 as a partial volume. To this end, a controllable voltage source 20 that is connected to the optical element is used as a conditioning element, the voltage source applying a positive potential to the multi-layer mirror 1—as shown in FIG. 1A—such that, as likewise illustrated in the figure, a positively charged ion is deflected away from the mirror. In particular, in the shown example, the positively charged ion is attracted to the housing 3 of the mini-environment 4, a negative potential having been applied to the housing.

By contrast, partial FIG. 1B shows the case in which the controllable voltage source is operated in such a way that the housing 3 of the mini-environment 4 is at a positive potential while, by contrast, the multi-layer mirror 1 is at a negative potential. In this case, a positively charged hydrogen ion is guided onto the multi-layer mirror, where it can be used for a cleaning process, for example. The housing 3 at a positive potential in this case additionally serves to concentrate the ions in the central region of the mini-environment, as described above, such that, as a result, a concentrated, directed ion beam arises.

Naturally, in the two illustrated cases, it is possible to not only control or regulate the polarity of the applied potential, but also the absolute value and, optionally, the time profile thereof.

Figure 2:
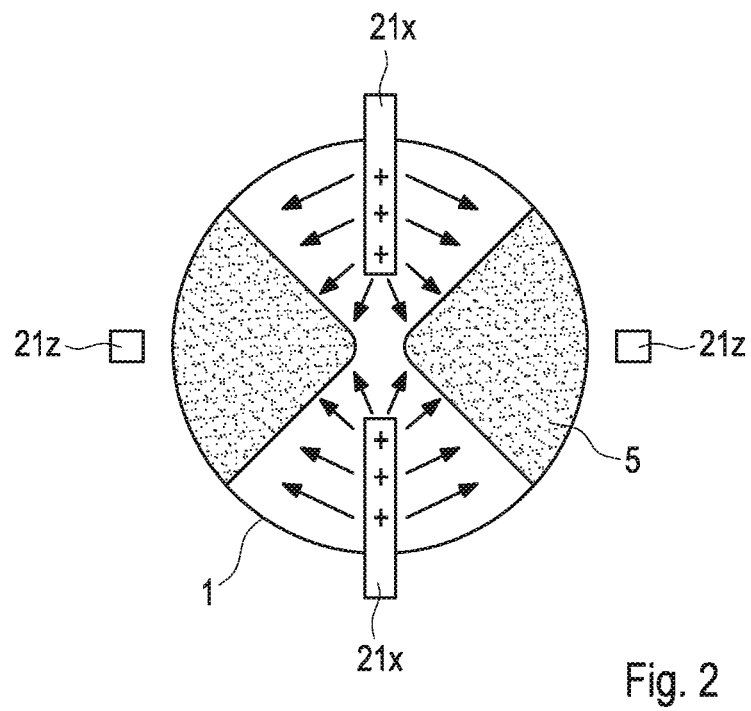
FIG. 2 shows a variant of the invention, in which a movable conditioning element is used.

FIG. 2 shows a variant of the invention, in which a movable conditioning element 21 is used, in the present case a pivotable electrically conductive finger 21, which is at a positive potential. In the shown example, the two fingers 21x lying opposite one another are active. In the present example, "active" should be understood to mean the operational state in which the fingers 21x are arranged in the region of the surface of an optical element 1, such as a multi-layer mirror, for example, or just above the surface thereof such that positively charged hydrogen ions are guided into the likewise depicted irradiated region 5 of the optical element 1, which is impinged by the EUV radiation. The two inactive fingers 21z, which are pivoted away from the surface of the multi-layer mirror 1 such that they supply no contribution to the deflection of the plasma constituents, are also illustrated. Depending on the selected spatial distribution of the illumination light, i.e., on the selected illumination setting, it is possible to then pivot fingers in or out in order to adapt the desired cleaning effect of the plasma constituents in respect of their local intensity.

Naturally, instead of using the electrostatically chargeable fingers 21x or 21z, it is also conceivable to use pivotable coils that produce a magnetic field such that the charged, moving plasma constituents are steered into the desired direction through the Lorentz force. In this case, the deflecting force acting on the charges also depends on the speed of the moving plasma constituents in addition to the dependence on the magnetic flux density, which may be used, where applicable, for selecting plasma constituents depending on their speed and hence depending on their degree of interaction with the corresponding surface.

Figure 3:
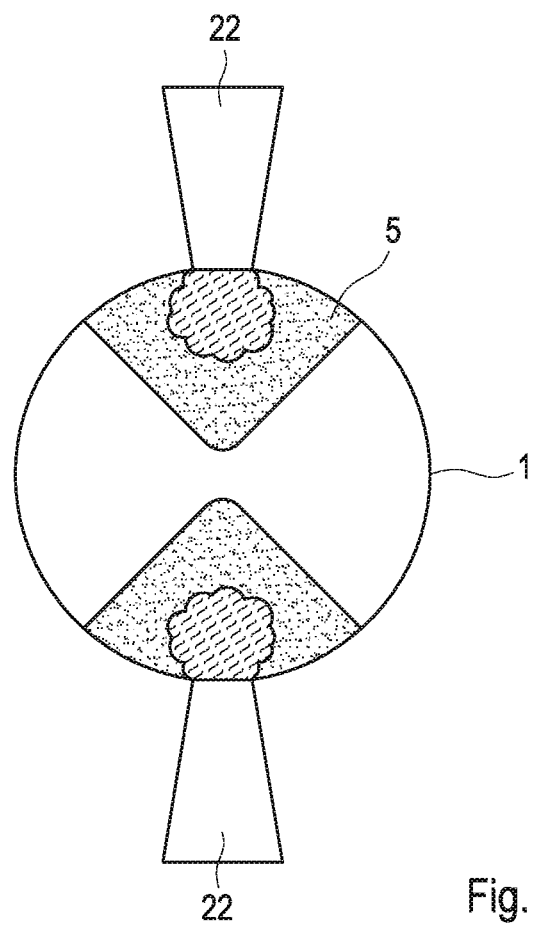
FIG. 3 shows an embodiment, in which a movable gas nozzle is used.

FIG. 3 shows an embodiment in which a movably embodied conditioning element 22, a movable gas nozzle in the shown example, is used for locally influencing the partial pressure of a gas. In the shown example, the movable gas nozzles 22 distribute the reactive species, i.e., ions and radicals, in a homogeneous fashion or depending on the expected or measured contamination profiles on the surface of an optical element 1 to be cleaned. Here, the plasma efficiency can be influenced by the increase of purge gas partial pressures undertaken in this way. It is also conceivable for plasma constituents to be neutralized by the aforementioned reactive species.

As an alternative, the cleaning heads, often present in any case, in projection exposure apparatuses may also receive such flexible positioning. As a result of this, the cleaning effect can be homogenized or inhomogeneously grown contaminations can be removed in a targeted manner.

Figure 4:
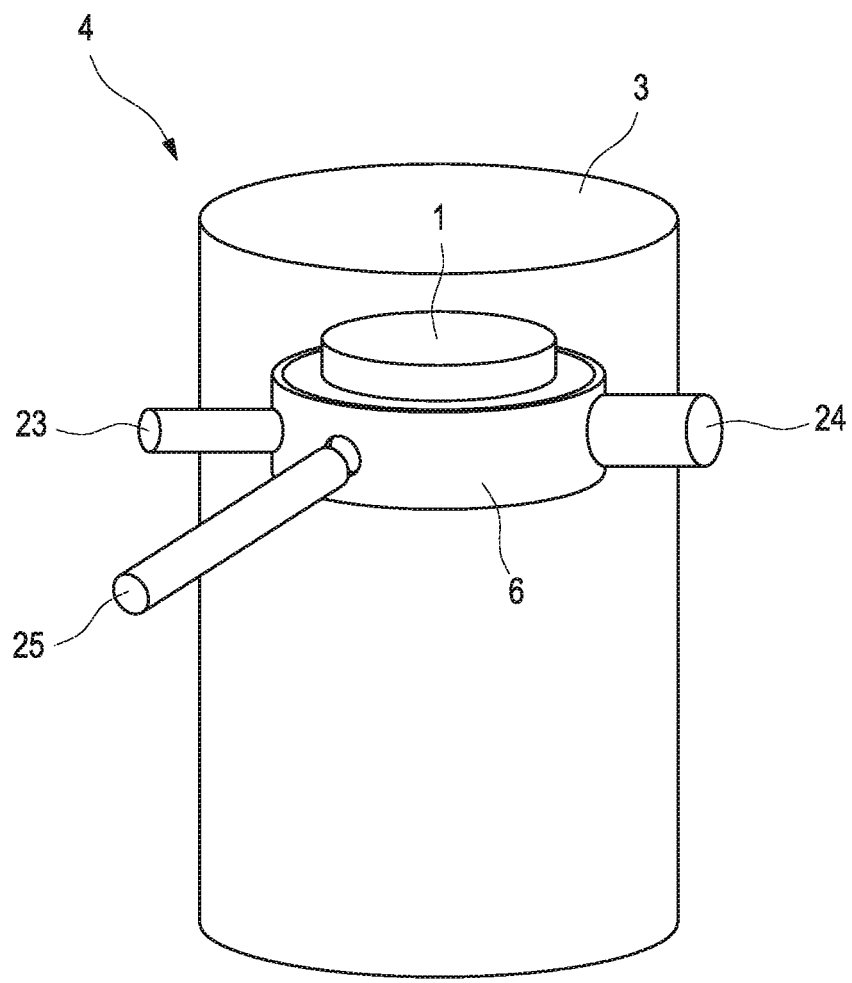
FIG. 4 shows a variant, in which a complete or partial targeted neutralization of the plasma is undertaken.

FIG. 4 shows a variant of the invention, in which a complete or partial targeted neutralization of the plasma is undertaken at critical positions. In the present embodiment, the conditioning element comprises a gas supply 23, the gas itself and a pump connector 24 and a local sub-volume 6, formed within a mini-environment 4 through a partial housing, in which sub-volume a gas with a large scattering cross section is introduced into the sub-volume 6 by way of the gas supply 23. Using a pump that is not separately illustrated in the figure, the gas, and hence the plasma constituents not desired in this region, can be pumped away well by way of the pump connector 24. Likewise, there can be a local pressure increase of the purge gas—$H_2$, as a rule—by way of the shown gas supply 23, as a result of which the free path length of the plasma constituents is reduced and a recombination into the gaseous phase is made more likely.

Furthermore, the figure shows an electron gun 25 as a conditioning element, the latter serving for partial neutralization of the plasma by electron bombardment. Here, the energy of the electrons should be selected in such a way that the recombination to form neutral particles is most probable. At the same time, parasitic effects such as electron dissociation and ionization must be kept as low as possible. The electron beam can be embodied as a fixed or movable beam, as a curtain or as irradiation of a volume.

Figure 5:
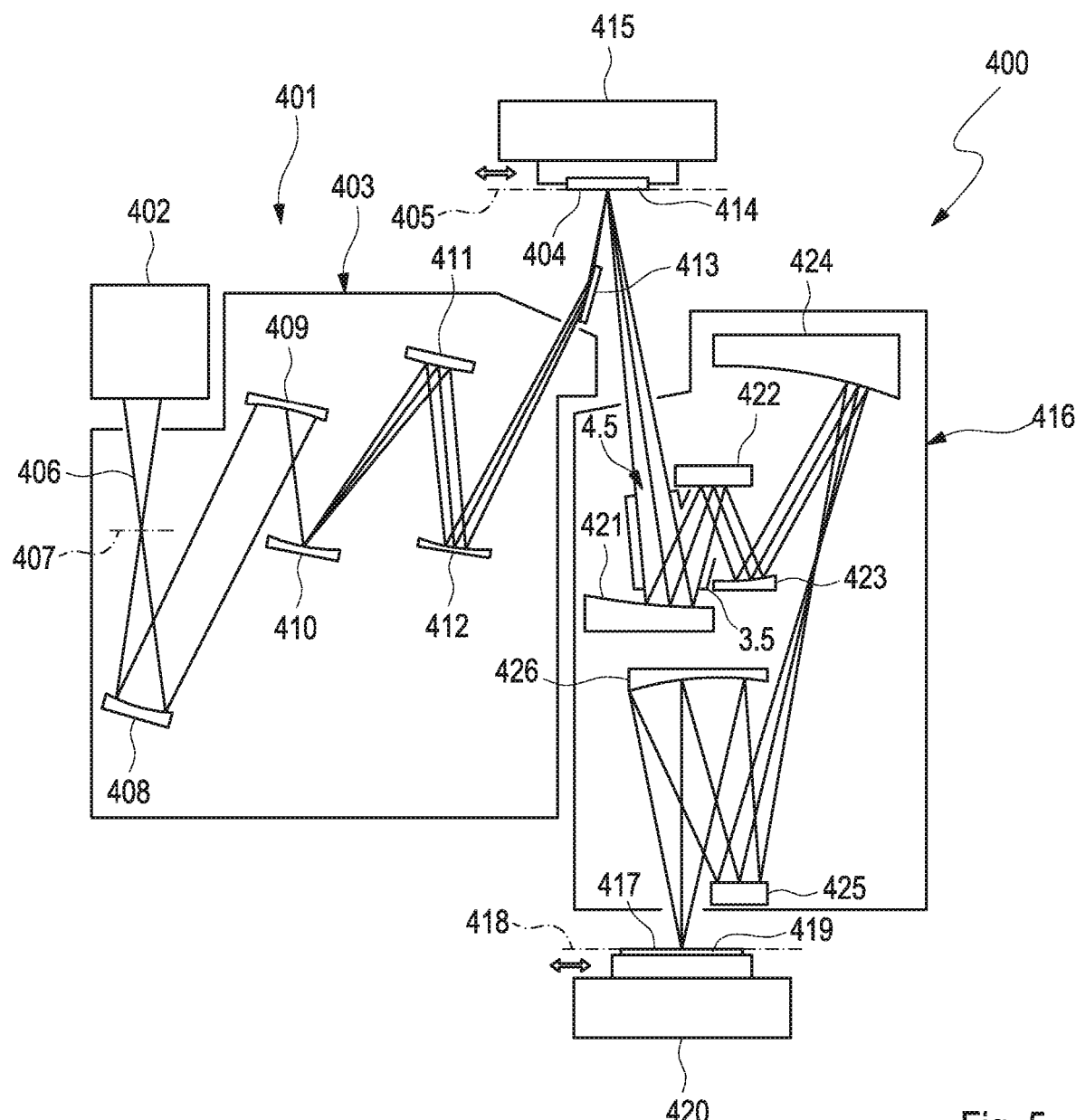
FIG. 5 shows a projection exposure apparatus for semiconductor lithography, in which the invention is used.

FIG. 5 shows by way of example the basic construction of a microlithographic EUV projection exposure apparatus 400, in which the invention likewise can find use. In addition to a light source 402, an illumination system 401 of the projection exposure apparatus 400 comprises an illumination optical unit 403 for illuminating an object field 404 in an object plane 405; here, the light source 402 can emit used optical radiation, particularly in the range between 5 nm and 30 nm, i.e., in the extreme ultraviolet (EUV) spectral range.

The EUV radiation 406 produced using the light source 402 is aligned with a collector (not illustrated in the figure), which is integrated in the light source 402, in such a way that the radiation passes through an intermediate focus in the region of an intermediate focal plane 407 before it is incident on a first mirror 408. After passing a further mirror 409, the EUV radiation is incident on the facet mirror 410, with which it is possible to set a desired spatial intensity distribution of the employed radiation, i.e., a desired setting. After further reflections at the mirrors 411, 412 and 413, the radiation prepared thus reaches a reticle 414 that is arranged in the object field 404 and held by a reticle holder 415, which is illustrated schematically.

A projection optical unit 416 serves for imaging the object field 404 into an image field 417 in an image plane 418. A structure on the reticle 414 is imaged on a light-sensitive layer of a wafer 419 held by a wafer holder 420 that is likewise illustrated in part, the wafer being arranged in the region of the image field 417 in the image plane 418.

Here, the projection optical unit 416 comprises the mirrors 421 to 426, which are usually embodied as so-called multi-layer mirrors and which serve to produce the image of the reticle on the wafer.

Here, a mini-environment 4.5, which is surrounded by the housing 3.5, is shown in exemplary fashion between the mirrors 421 and 422. This mini-environment, in conjunction with a voltage source that is not illustrated in the figure, is able to serve to produce a directed ion beam onto the mirror 421 and/or onto the mirror 422. The conditioning elements described in the figures above can be positioned at a multiplicity of the elements shown in the figure. A person skilled in the art will select the type, design and location of the respective conditioning element in accordance with the respective requirements.

Figure 6:
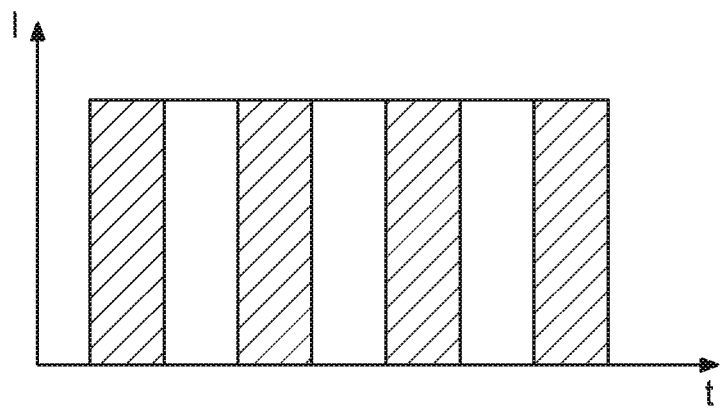
FIG. 6 shows a graphical elucidation of the temporal design of the measures for actuating the conditioning elements.

FIG. 6 elucidates how EUV dead times are exploited for measures for conditioning the plasma. EUV dead times are understood to be times during which there is no wafer illumination. Such times can be used, in particular, for off-line cleaning of optical elements. Thus, for example, regularly recurring dead times between wafer changes can be used. FIG. 6 shows the intensity of the EUV radiation on the ordinate over time, which is plotted on the abscissa. The times during which there is an EUV exposure are hatched. Times that are available for cleaning are not hatched.

| List of reference signs | |
|---|---|
| Reference sign | Designation |
| 1 | Optical element |
| 3 | Housing |
| 4 | Mini-environment |
| 5 | Region irradiated by EUV radiation |
| 6 | Sub-volume |
| 20 | Voltage source |
| 21 | Pivotable fingers |
| 22 | Gas nozzle |
| 23 | Gas supply |
| 24 | Pump connector |
| 25 | Electron gun |
| 400 | EUV projection exposure apparatus |
| 401 | Illumination system |
| 402 | Light source |
| 403 | Illumination optical unit |
| 404 | Object field |
| 405 | Object plane |
| 406 | EUV radiation |
| 407 | Intermediate focal plane |
| 408-414 | Mirror |
| 414 | Reticle |
| 415 | Reticle holder |
| 416 | Projection optical unit |
| 417 | Image field |
| 418 | Image plane |
| 419 | Wafer |
| 420 | Wafer holder |
| 421-426 | Multi-layer mirror |

What is claimed is:

1. A projection exposure apparatus for semiconductor lithography, comprising:

at least one partial volume that is closed off from surroundings and has a purge gas arranged therein; and
at least one conditioning element,
wherein the at least one conditioning element at least partially neutralizes plasma in the at least one partial volume generated by electromagnetic radiation used for projection exposure acting on the purge gas, and
wherein the at least one conditioning element is attached to an optical element arranged in the at least one partial volume.

2. The projection exposure apparatus as claimed in claim 1, wherein the at least one conditioning element produces an increase in a local pressure of the purge gas.

3. The projection exposure apparatus as claimed in claim 1, wherein the at least one conditioning element locally introduces a plurality of electrons into the partial volume.

4. The projection exposure apparatus as claimed in claim 1, wherein the at least one conditioning element locally influences partial pressures of the purge gas.

5. The projection exposure apparatus as claimed in claim 1, wherein the partial volume is defined by a housing.

6. The projection exposure apparatus as claimed in claim 1, wherein the at least one conditioning element is configured to produce a directed ion beam.

7. The projection exposure apparatus as claimed in claim 1, wherein the at least one conditioning element is configured to receive an adjustable electric potential.

8. The projection exposure apparatus as claimed in claim 1, wherein the at least one conditioning element is configured to produce a magnetic field.

9. The projection exposure apparatus as claimed in claim 1, wherein the at least one conditioning element is movable.

10. A projection exposure apparatus for semiconductor lithography, comprising:
at least one partial volume that is closed off from surroundings and has a purge gas arranged therein; and
at least one conditioning element,
wherein the at least one conditioning element at least partially neutralizes plasma in the at least one partial volume generated by electromagnetic radiation used for projection exposure acting on the purge gas,
wherein the at least one conditioning element locally introduces a neutralization gas into the at least one partial volume,
wherein the plasma is generated as a side effect of the electromagnetic radiation acting on the purge gas, and
wherein the purge gas is a hydrogen gas.

11. The projection exposure apparatus as claimed in claim 10, wherein the at least one conditioning element comprises:
a local sub-volume configured to receive the another gas having a large scattering cross section via a gas supply and to introduce the neutralization gas into the partial volume.

12. The projection exposure apparatus as claimed in claim 11, wherein the at least one conditioning element further comprises:
a pump connector which connects a pump to the local sub-volume and via which at least a portion of the purge gas is pumped away from the at least one partial volume.

13. The projection exposure apparatus as claimed in claim 12, wherein the at least one conditioning element further comprises:
an electron gun which shoots a plurality of electrons into the at least one partial volume to at least partially neutralize the plasma.

14. A method for operating a projection exposure apparatus for semiconductor lithography, comprising:
producing a plasma in at least one partial volume that is closed off from surroundings, and
at least partly neutralizing the plasma in the partial volume with at least one conditioning element,
wherein the plasma in the at least one partial volume is produced by an electromagnetic radiation used for projection exposure acting on a purge gas, and
wherein the at least one conditioning element is attached to an optical element, arranged in the at least one partial volume.

15. The method as claimed in claim 14,
wherein the plasma is at least partly neutralized at times in which the electromagnetic radiation is not directed onto the optical element arranged in the partial volume during a lithography projection exposure.

16. The method as claimed in claim 14, further comprising:
locally purging, in at least one region of the at least one partial volume, high vacuum by using the purge gas which is a hydrogen gas,
wherein the neutralizing the plasma includes increasing local pressure by metering-in a nitrogen gas to increase a formation of nitrogen-hydrogen compounds, and
wherein the neutralizing the plasma includes reducing concentration of the plasma.

17. A projection exposure apparatus for semiconductor lithography, comprising:
at least one partial volume that is closed off from surroundings and has a purge gas arranged therein; and
at least one conditioning element, wherein the at least one conditioning element at least partially neutralizes plasma in the at least one partial volume generated by electromagnetic radiation used for projection exposure acting on the purge gas,
wherein an optical element arranged in the partial volume is configured to reflect the electromagnetic radiation which is an extreme ultraviolet (EUV) radiation, and
wherein the at least one conditioning element further influences an electric potential of the optical element arranged in the at least one partial volume.

18. The projection exposure apparatus as claimed in claim 17, wherein the at least one conditioning element includes a controllable voltage source that is connected to the optical element and a housing of the partial volume,
wherein the controllable voltage source applies a positive potential to the optical element so as to attract positively charged ions to the housing of the partial volume to which a negative potential is applied, and
wherein the controllable voltage source applies a negative potential to the optical element so as to attract the positively charged ions to the optical element to clean the optical element.

* * * * *

UNITED STATES PATENT AND TRADEMARK OFFICE
CERTIFICATE OF CORRECTION

PATENT NO. : 10,712,677 B2
APPLICATION NO. : 16/198331
DATED : July 14, 2020
INVENTOR(S) : Irene Ament et al.

Page 1 of 1

It is certified that error appears in the above-identified patent and that said Letters Patent is hereby corrected as shown below:

In the Claims

Column 8, Line 18, In Claim 15, after "claim 14," insert -- and --.

Signed and Sealed this
Twenty-ninth Day of December, 2020

Andrei Iancu
*Director of the United States Patent and Trademark Office*